(12) United States Patent
Megrant

(10) Patent No.: US 10,930,836 B2
(45) Date of Patent: Feb. 23, 2021

(54) REDUCING SURFACE LOSS AND STRAY COUPLING IN QUANTUM DEVICES USING DIELECTRIC THINNING

(71) Applicant: Google LLC, Mountain View, CA (US)

(72) Inventor: Anthony Edward Megrant, Goleta, CA (US)

(73) Assignee: Google LLC, Mountain View, CA (US)

( * ) Notice: Subject to any disclaimer, the term of this patent is extended or adjusted under 35 U.S.C. 154(b) by 274 days.

(21) Appl. No.: 16/066,190

(22) PCT Filed: Dec. 30, 2015

(86) PCT No.: PCT/US2015/068102

§ 371 (c)(1),
(2) Date: Jun. 26, 2018

(87) PCT Pub. No.: WO2017/116439

PCT Pub. Date: Jul. 6, 2017

(65) Prior Publication Data

US 2020/0127187 A1 Apr. 23, 2020

(51) Int. Cl.
*H01L 39/08* (2006.01)
*G06N 10/00* (2019.01)
*H01L 49/02* (2006.01)
*H01L 39/12* (2006.01)
*H01P 3/00* (2006.01)

(52) U.S. Cl.
CPC .............. *H01L 39/08* (2013.01); *G06N 10/00* (2019.01); *H01L 28/60* (2013.01); *H01L 39/12* (2013.01); *H01P 3/003* (2013.01)

(58) Field of Classification Search
CPC .......... H01L 39/08; H01L 28/60; H01L 39/12; G06N 10/00; H01P 3/003
USPC ........................................................ 333/238
See application file for complete search history.

(56) References Cited

U.S. PATENT DOCUMENTS

| 2004/0012407 A1 | 1/2004 | Amin et al. |
| 2011/0175061 A1 | 7/2011 | Berkley et al. |
| 2014/0264286 A1 | 9/2014 | Chang et al. |
| 2016/0126381 A1* | 5/2016 | Wang ................... H01L 31/024 257/429 |

OTHER PUBLICATIONS

Slepyan et al., "Anomalous electromagnetic coupling via entanglement at the nanoscale", published on Feb. 2, 2017 on New J. Phys. 19 (2017) 023014 (Year: 2017).*

(Continued)

*Primary Examiner* — Benny T Lee
*Assistant Examiner* — Hafizur Rahman
(74) *Attorney, Agent, or Firm* — Fish & Richardson P.C.

(57) ABSTRACT

A quantum device includes: a substrate; and at least three co-planar structures arranged on a surface of the substrate, each co-planar structure, of the at least three co-planar structures, including a superconductor, in which a first effective dielectric constant between a first co-planar structure and a second co-planar structure that is a nearest neighbor to the first co-planar structure is above a first threshold, a second effective dielectric constant between the first co-planar structure and a third co-planar structure that is a next nearest neighbor to the first so-planar structure is less than a second threshold, and the second threshold is less than the first threshold.

16 Claims, 5 Drawing Sheets

(56) References Cited

OTHER PUBLICATIONS

Schmitt, "Design, fabrication and test of a four superconducting quantum-bit processor", Universite Pierre et Marie Curie—Paris, Ph.D. thesis submitted in Oct. 2015. (Year: 2015).*
Coffey, "The Incremental Quest for Quantum Computing" published in Photonics Spectra on Jun. 2014. (Year: 2014).*
International Search Report and Written Opinion for International Application No. PCT/2015/068102, dated May 10, 2016.

* cited by examiner

REDUCING SURFACE LOSS AND STRAY COUPLING IN QUANTUM DEVICES USING DIELECTRIC THINNING

CROSS-REFERENCE TO RELATED APPLICATIONS

This application claims priority to and is a U.S. National Phase under 371 of International Application No. PCT/US2015/068102, filed on Dec. 30, 2015, and is incorporated by reference in its entirety.

TECHNICAL FIELD

The present disclosure relates to reducing surface loss and stray coupling in quantum devices using dielectric thinning.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|0\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in some aspects, the subject matter of the present disclosure can be embodied in one or more quantum devices that include: a substrate; and at least three co-planar structures arranged on a surface of the substrate, each co-planar structure, of the at least three co-planar structures, including a superconductor, in which a first effective dielectric constant between a first co-planar structure and a second co-planar structure that is a nearest neighbor to the first co-planar structure is above a first threshold, a second effective dielectric constant between the first co-planar structure and a third co-planar structure that is a next nearest neighbor to the first so-planar structure is less than a second threshold, and the second threshold is less than the first threshold.

Implementations of the one or more devices can include one or more of the following features or other features described herein. For example, the first effective dielectric constant can include a first weighted average of the substrate dielectric constant and the dielectric constant of an ambient region adjacent to the substrate, and the second dielectric constant can include a second weighted average of the substrate dielectric constant and the dielectric constant of the ambient region adjacent to the substrate.

In some implementations, the first threshold is approximately 8.

In some implementations, the second threshold is approximately 2.

In some implementations, the substrate includes silicon.

In some implementations, the substrate includes sapphire.

In some implementations, the superconductor includes aluminum.

In some implementations, the superconductor includes niobium.

In some implementations, at least one co-planar structure, of the at least three co-planar structures, includes a corresponding qubit.

In some implementations, at least one co-planar structure, of the at least three co-planar structures, includes a corresponding co-planar waveguide.

In some implementations, at least one co-planar structure, of the at least three co-planar structures, includes a corresponding arm of an inter-digitated capacitor.

In some implementations, the first co-planar structure is separated from the second co-planar structure by a first gap, and the second co-planar structure is separated from the third co-planar structure by a second gap.

In some implementations, the at least three co-planar structures are arranged in a 1-D array.

In some implementations, the at least three co-planar structures are arranged in a 2-D array.

In some implementations, the ambient region includes a vacuum.

In some implementations, the substrate includes a first region that is thinner than a second region of the substrate. The first region can be aligned with a first co-planar structure on the surface of the substrate (e.g., a straight line axis extends through both the first co-planar structure and the first region) such that a capacitive coupling to the first co-planar structure is lower than a capacitive coupling to a different co-planar structure aligned with the second region of the substrate (e.g., a straight line axis extends through both the second co-planar structure and the second region).

In general, in another aspect, the subject matter of the present disclosure can be embodied in one or more quantum devices that include: a substrate; and at least three co-planar structures arranged on a surface of the substrate, each co-planar structure, of the at least three co-planar structures, includes a superconductor, in which a first effective dielectric constant between a first co-planar structure, of the at least three co-planar structures, and a second co-planar structure, of the at least three co-planar structures, is above a first threshold, a second effective dielectric constant between the first co-planar structure and a third co-planar structure, of the at least three co-planar structures, is less than a second threshold, a first distance between the first co-planar structure and the second co-planar structure is less than a second distance between the first co-planar structure and the third co-planar structure, and the second threshold is less than the first threshold.

Implementations of the one or more quantum devices can include one or more of the following features or other features described herein. For example, in some implementations, the first effective dielectric constant includes a first average of the substrate dielectric constant and the dielectric constant of an ambient region adjacent to the substrate, and the second dielectric constant includes a second different average of the substrate dielectric constant and the dielectric constant of the ambient region adjacent to the substrate.

In some implementations, the substrate dielectric constant of the first average is weighted to a first value, and the substrate dielectric constant of the second average is weighted to a second different value.

In some implementations, the first distance is between a centroid of the first co-planar structure and a centroid of the second co-planar structure, and the second distance is between the centroid of the first co-planar structure and a centroid of the third co-planar structure.

In some implementations, each co-planar structure, of the at least three co-planar structures, includes a corresponding qubit, co-planar waveguide, or interdigitated capacitor.

In some implementations, the substrate includes a first region that is thinner than a second region of the substrate. The first region can be aligned with a first co-planar structure on the surface of the substrate (e.g., a straight line axis extends through both the first co-planar structure and the first region) such that a capacitive coupling to the first co-planar structure is lower than a capacitive coupling to a different co-planar structure aligned with the second region of the substrate (e.g., a straight line axis extends through both the second co-planar structure and the second region).

For the purposes of this disclosure, a superconductor (alternatively, superconducting) material can be understood as a material that exhibits superconducting properties at or below a superconducting critical temperature. Examples of superconductor material include aluminum (superconducting critical temperature of 1.2 kelvin) and niobium (superconducting critical temperature of 9.3 kelvin).

For the purposes of this disclosure, a first co-planar structure and a second adjacent co-planar structure can be understood to be "nearest neighbors" when there are no intervening co-planar structures between the first and the second co-planar structures.

For the purposes of this disclosure, a first co-planar structure a second co-planar structure can be understood to be "next nearest neighbors" when there is a third co-planar structure between the first co-planar structure and the second co-planar structure.

Various advantages can be realized with one or more aspects and/or implementations of the present disclosure. For example, in some implementations, surface loss and stray coupling in quantum devices can be reduced. For instance, by decreasing the thickness of the underlying dielectric substrate on which co-planar quantum circuit elements are formed, the effective dielectric constant associated with stray capacitive coupling to undesired quantum circuit elements, and thus the strength of the stray capacitive coupling, can be reduced without substantially altering the capacitive coupling to desired quantum circuit elements. By scaling up the size of one or more co-planar structures, the surface loss experience by those structures can be reduced.

The details of one or more embodiments are set forth in the accompanying drawings and the description below. Other features and advantages will be apparent from the description, drawings, and the claims.

DETAILED DESCRIPTION

Quantum computing entails coherently processing quantum information stored in the qubits of a quantum computer. In certain types of quantum computing processors, such as quantum annealers, the qubits of the quantum processor are coupled together in a controllable manner such that the quantum state of each qubit affects the corresponding quantum states of the other qubits to which it is coupled. In certain quantum computing designs, the qubits may suffer energy loss and decoherence due to interactions with two level systems. In quantum computers that use qubits formed from superconductor materials, such two level systems are typically found on the surfaces and interfaces of the materials used to fabricate the qubits and other components of the computers. Fabrication of integrated quantum circuit elements with superconducting components typically involves depositing and patterning dielectrics and metal layers. The superconducting quantum circuit elements, such as quantum bits (qubits), inductance based photon detectors, and linear resonators, among others, rely on low loss reactive microwave components to achieve a high quality factor Q. However, deposited dielectrics often exhibit significant loss in the low temperature, low power regime due to the presence of two-level state (TLS) defects, limiting their utility for quantum circuits. While quantum circuit element structures having relatively large planar designs can reduce the sensitivity to lossy surface dielectrics, such large planar structures also couple more strongly to other undesired qubits and modes. Such undesired coupling can negatively affect the performance of a quantum processor since it is often necessary to carefully set and adjust capacitive coupling between qubits, resonators, and control circuitry.

The present disclosure relates to reducing the surface loss and stray coupling in quantum devices using dielectric thinning. By decreasing the thickness of the underlying dielectric substrate on which co-planar quantum circuit elements are formed, the effective dielectric constant associated with stray capacitive coupling to undesired quantum circuit elements, and thus the strength of the stray capacitive coupling, can be reduced without substantially altering the capacitive coupling to desired quantum circuit elements.

Figure 1:
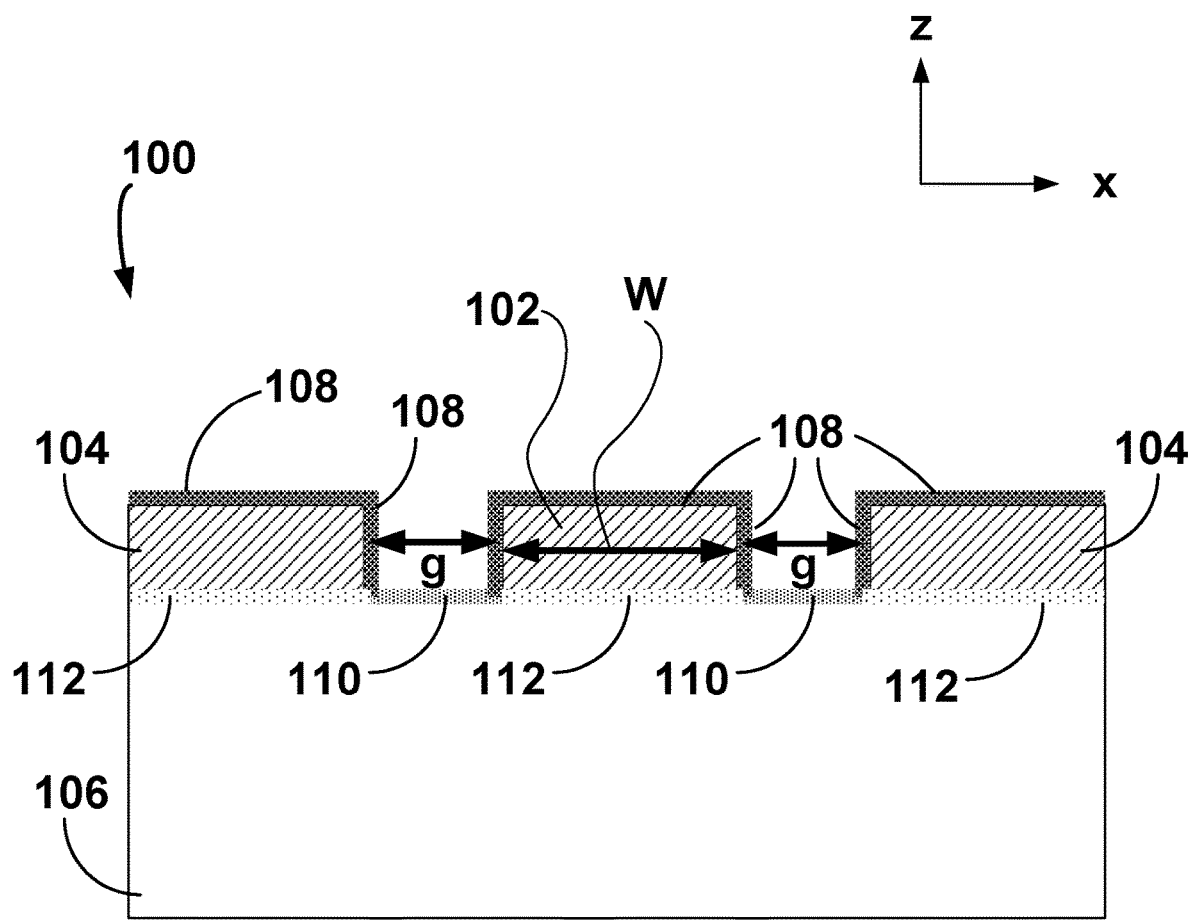
FIG. 1 is a schematic that illustrates a cross-sectional view of an example co-planar structure.

To understand how dielectric thinning improves surface loss, while reducing stray capacitive coupling, it is helpful to first review how the losses can arise and affect the quality factor Q in planar structures. FIG. 1 is a schematic that illustrates a cross-sectional view of an example co-planar structure 100 (not drawn to scale) that is typically found in quantum processors employing superconducting electrical circuits. In particular, the co-planar structure 100 is a superconducting co-planar waveguide. Superconducting co-planar waveguides can be used, for example, as resonant devices for circuit quantum electrodynamics (circuit QED), as elements for quantum computation, and to create and decohere quantum photon states, among other uses. The co-planar waveguide 100 shown in FIG. 1 is presented as an example device for the purpose of discussing how losses arise in co-planar resonant structures. However, the same sources of loss described with respect to the co-planar waveguide 100 also apply to other co-planar structures that can be used in superconducting electrical circuits for quantum processors, such as qubits or interdigitated capacitors.

The co-planar waveguide 100 includes a signal carrying centerline 102 flanked by two grounded planes 104, each of which is formed from superconductor material, such as such as aluminum (Al) or niobium (Nb). As FIG. 1 presents a side-view of the structure 100, it is understood that the ground planes 104 and centerline 102 extend into and/or out of the page (e.g., along the y-direction). The planar superconducting structure is arranged on a dielectric substrate 106 (e.g., silicon (Si) or sapphire ($Al_2O_3$)) typically by a photolithographic process. The centerline 102 has a width w, and is separated from the ground planes 104 on either side by a gap of distance g.

The quality factor Q of a co-planar structure, such as the co-planar waveguide 100, is the inverse of the structure's loss. The total loss of a co-planar structure is equal to the sum of all losses attributable to the structure's bulk and interfaces. For instance, the total loss ($1/Q_{total}$) of a resonator given the structure shown in FIG. 1 can be expressed as $1/Q_{total} = 1/Q_{substrate} + 1/Q_{sc} + 1/Q_{sc-air} + 1/Q_{sub-air} + 1/Q_{sub-sc}$, where $1/Q_{substrate}$ is the loss due to the bulk dielectric substrate, $1/Q_{sc}$ is the loss due to the bulk superconductor layer, $1/Q_{sc-air}$ is the loss at the superconductor-air interface 108, $1/Q_{sub-air}$ is the loss at the substrate-air interface 110, and $1/Q_{sub-sc}$ is the loss at the substrate-superconductor interface 112. The dielectric and superconductor are high quality, low loss materials, such that the dominant loss mechanism is through the interfaces, which tend to have high loss tangents relative to the bulk materials (e.g., tan δ for the interfaces can be assumed to be in the range of $2*10^{-3}$ compared to loss tangents that are several orders of magnitude lower for the bulk material). An approach to further reduce the amount of energy stored in the lossy interfaces includes scaling up the co-planar structure. For example, the width (w+2g) of the centerline of the structure 100 can be increased so that the strength of the electric fields extending between the superconducting lines weakens. For co-planar waveguides, such as the structure shown in FIG. 1, increasing the width of the centerline 102 decreases the loss according to $w^{-2/3}$ for trace widths w≤g and flattens off for w>g, where g is fixed. In general, similar reductions in loss can be achieved for co-planar structures other than the co-planar waveguide shown in FIG. 1

Some of the difficulties with increasing the size of the co-planar structure, however, are that it reduces the amount of space available on a wafer for placing additional components, while it increases the amount of stray coupling capacitance to undesired components. In particular, the coupling capacitance C between two co-planar electrodes of arbitrary shape can be expressed as:

$$C_{12} \approx (\varepsilon/\pi) A_1 A_2 / r_{12}^3, \quad (1)$$

where ε is the effective dielectric constant of the dielectrics through which the electric fields travel, $A_1$ and $A_2$ are the areas of the electrodes 1 and 2 (e.g., as measured along the x-y plane in FIG. 1), and $r_{12}$ is the distance between the centroids of each electrode (e.g., between the centroid of ground plane 104 and centroid of centerline 102). Thus, as the co-planar structure increases in size, the values for $A_1$ and $A_2$ increase, leading to an increase in coupling capacitance between circuit elements within the device.

Figure 2:
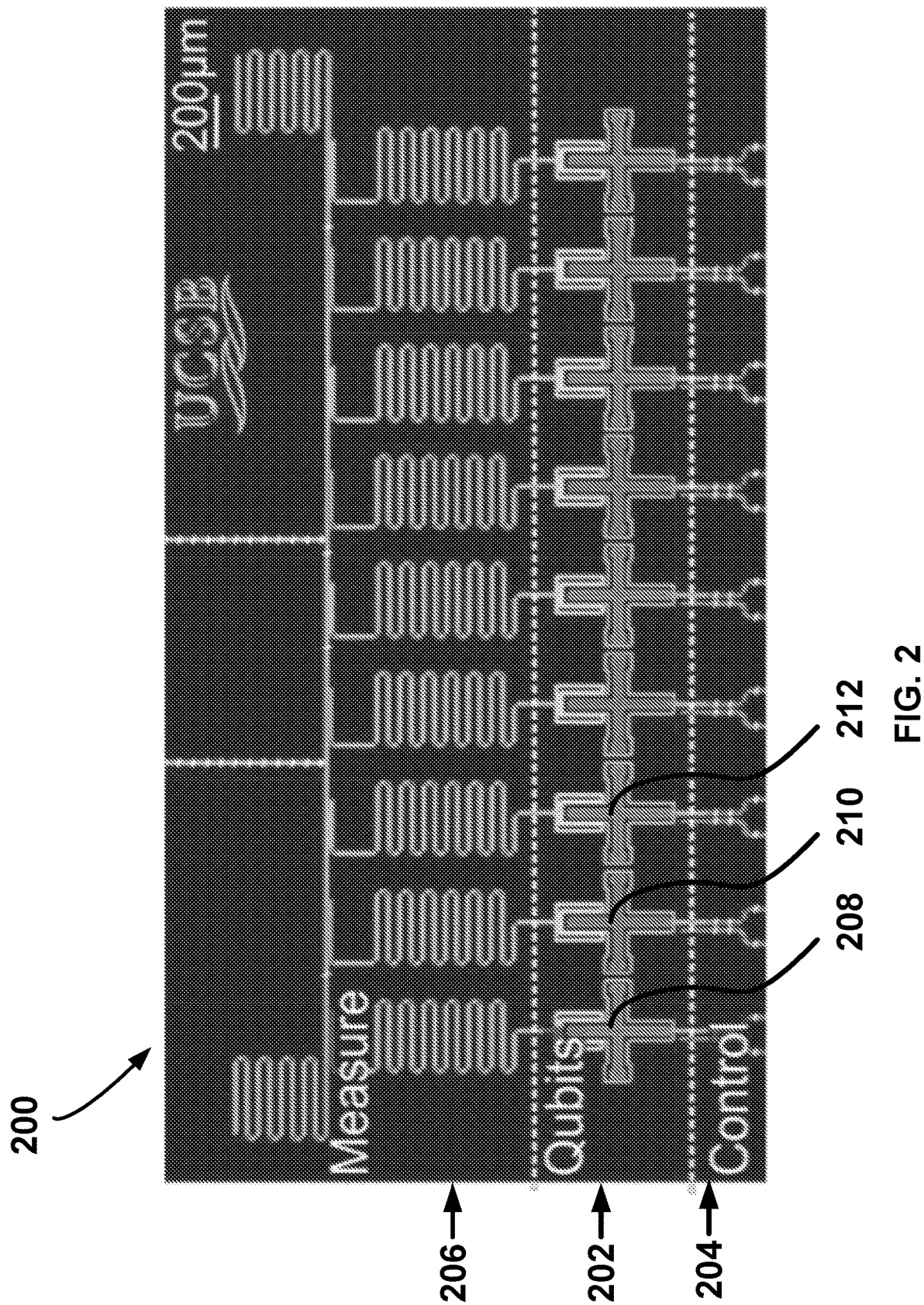
FIG. 2 is a schematic illustrating a top view of an example quantum processing device.

Increased stray coupling can be a significant challenge when incorporating ever larger numbers of quantum circuit elements within a quantum processor. This is because the stray coupling can lead to cross-talk between qubit control signals as well as cross-talk between individual qubits. A top view of an example quantum processing device 200 in which such cross-talk can occur is illustrated in FIG. 2. The device 200 includes multiple co-planar structures (e.g., Xmon qubits) 202 arranged in a 1D array, in which each qubit is coupled to corresponding control elements 204 (for modifying the qubit state and tuning the qubit frequency) and a measurement device 206 for reading the state of the qubit. Operation of the device entails inducing neighboring qubits 202 to interact through quantum entanglement. For instance, both a first qubit 208 and a second nearest neighbor qubit 210 are excited to separate transition frequencies around 5-6 GHz, and then brought close together in frequency using the control elements 204 so that entanglement between the qubits occurs. For the purposes of this disclosure, two co-planar structures (e.g., two qubits or two co-planar waveguides, among other structures) can be understood to be "nearest neighbors" when there are no intervening co-planar structures to induce stray coupling between the two co-planar structures. A co-planar structure does not necessarily have to include a single contiguous layer of material (e.g., superconducting material) without gaps between different portions of the structure. For instance, a co-planar structure can include a co-planar waveguide that has a center signal line and two ground lines separated from the center line by corresponding gaps. The gaps may be filled with air, vacuum and/or a dielectric. Alternatively, a co-planar structure can include a qubit, such as a superconducting persistent current qubit that includes a superconducting loop interrupted by three Josephson junctions. Furthermore, a first co-planar structure can be understood to be separate from a second co-planar structure when the components of the first co-planar structure form or can be viewed as a distinct operational unit apart from the components of the second co-planar structure, which form or can be viewed as their own operational unit. In some implementations, the region between separate nearest neighbor co-planar structures may be filled with air, vacuum, and/or a dielectric. In certain implementations, such as when employing surface code quantum error correction, it is preferable that just the nearest neighbor qubits entangle during this procedure. For example, operation of the device might require capacitive coupling between the first qubit 208 and the second qubit 210 or between the second qubit 210 and the third qubit 212, but not between the first qubit 208 and the third qubit 212.

The presence of significant stray coupling capacitance can, however, lead to unwanted coupling with next nearest neighbor qubits rather than just nearest neighbor qubits. For the purposes of this disclosure, two co-planar structure can be understood to be "next nearest neighbors" when there is an additional co-planar structure between them. For instance, in the example shown in FIG. 2, stray capacitive coupling can cause unwanted entanglement between the first qubit 208 and the third qubit 212, as well as unwanted excitation of the third qubit 212 through cross-talk of control signals from the first qubit 208 and vice versa. Such undesired entanglement and cross-talk results in phase errors and decoherence, rendering operation of the device 200 inefficient and difficult. Compensation of unwanted stray coupling can, in some cases, become an intractable problem for devices having larger numbers of qubits. Stray coupling can be especially problematic in devices where the array of qubits is expanded in two dimensions (e.g., a 2D array) versus one, such that for a single qubit, stray capacitive coupling to a next nearest neighbor qubit potentially occurs in four different directions.

From eq. (1), the reach and influence of unwanted stray capacitance can be reduced by decreasing the area $A_1$ or $A_2$ of the electrodes and/or by increasing the distance $r_{12}$ between the electrodes. However, decreasing the electrode area leads to an increase in the surface loss. And increasing the distance $r_{12}$ can reduce the amount of space available on a wafer for placing additional components, as explained above.

A third option for reducing the influence of stray coupling capacitance is to decrease the effective dielectric constant ε. The effective dielectric constant is the weighted average of the dielectrics above and below the plane of co-planar electrically conducting structures. For a relatively thick substrate having a finite thickness t where the thickness of the substrate is much larger than the distance between the electrodes under consideration, the value of the effective dielectric constant ε is essentially equal to the average of the vacuum dielectric constant (assuming a vacuum above the co-planar structures) and the substrate dielectric constant, since the substrate is so thick. For instance, for a thick (e.g., t<<distance r between electrodes) dielectric substrate formed from sapphire, the effective dielectric constant ε is approximately equal to the dielectric constant of bulk sapphire, $\varepsilon_s \approx 10.3$ (measured at a temperature of 50 mK and an applied frequency of between 4-6 GHz). (Silicon, which is an alternative dielectric substrate that can be used, has a dielectric permittivity of approximately 11.6, measured at a temperature of 50 mK and an applied frequency of between approximately 4-6 GHz.) This is because essentially all of the electric field lines extending from the first co-planar structure to both the nearest neighbor co-planar structure and the next nearest neighbor co-planar structure are contained within the bulk substrate. By reducing the substrate thickness, however, part of the electric field lines travel through both the substrate and a region beneath the substrate. When the region beneath the substrate is air or vacuum, which have a dielectric constant of 1, the effective dielectric constant associated with coupling between two co-planar structures becomes a value somewhere between 1 and $\varepsilon_s$ depending on the substrate thickness t and the separation distance r between the centroids of the co-planar structures.

Figure 3:
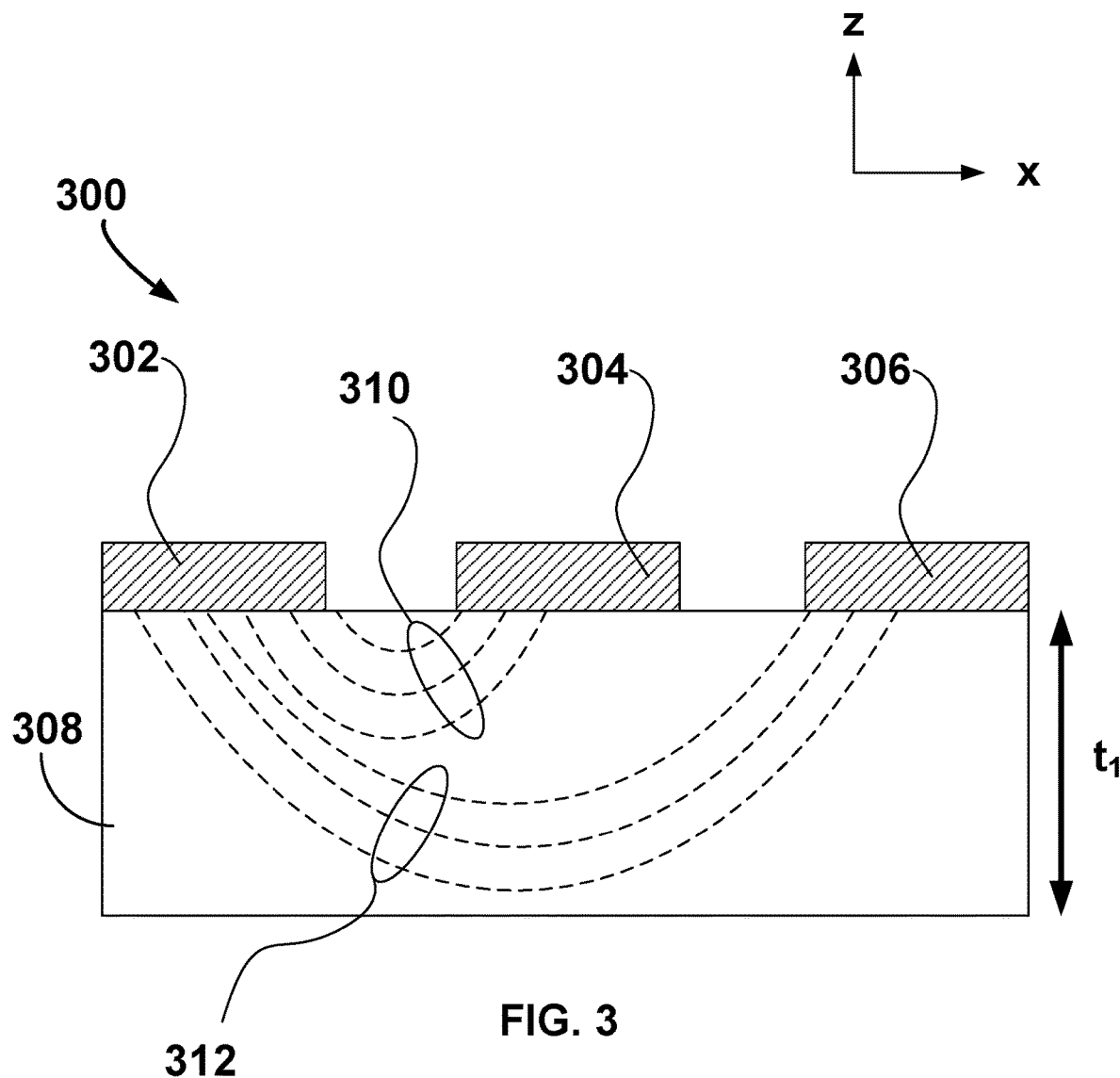
FIG. 3 is a schematic that illustrates a cross-sectional view of an example device having multiple co-planar structures.
Figure 4:
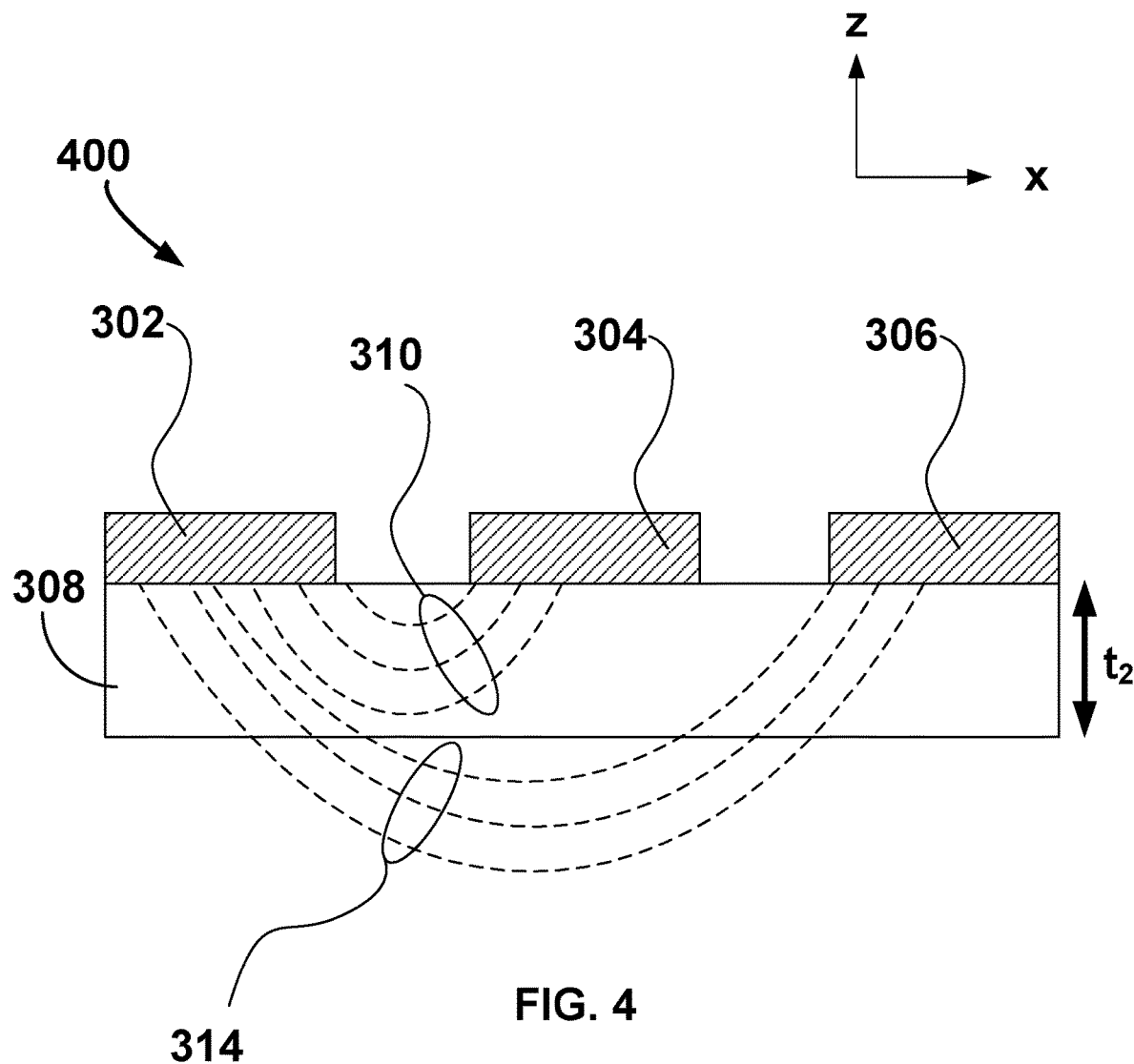
FIG. 4 is a schematic that illustrates a cross-sectional view of an example device having multiple co-planar structures.

The foregoing concept is illustrated with respect to FIGS. 3 and 4. FIG. 3 is a schematic that illustrates a side view of a device 300 containing three superconducting co-planar structures formed on a dielectric substrate 308: first co-planar structure 302, second co-planar structure 304 and third co-planar structure 306. Each co-planar structure is separated from its nearest neighbor structure by a gap distance g and also extends into and/or out of the page (e.g., along the y-direction). Although each co-planar structure is shown as a single rectangular solid layer on substrate 308, the co-planar structures are not restricted to this form. Instead, the structures 302, 304 and 306 shown in FIG. 3 are intended to be representative examples and other structure shapes and configurations are also possible. For instance, each co-planar structure can correspond to all or part of a qubit. Alternatively, each co-planar structure can correspond to a co-planar waveguide having a centerline and two ground planes, such as the structure shown in FIG. 1. Other superconducting structure configurations are also possible.

As shown in FIG. 3, both the electric field lines 310 extending from the first co-planar structure 302 to its nearest neighbor structure 304, and the electric field lines 312 extending from the first co-planar structure 302 to its next nearest neighbor 306 are contained within the dielectric substrate 308 having a first thickness $t_1$. Thus, the effective dielectric constant for capacitive coupling to the nearest neighbor structure 304, $\varepsilon_{NN}$, and the effective dielectric constant for capacitive coupling to the next nearest neighbor structure 306, $\varepsilon_{NNN}$, are approximately equal to the weighted average of the dielectric constant $\varepsilon_s$ of the substrate 308 and the dielectric constant of the vacuum region above the co-planar structures.

FIG. 4 is a schematic that illustrates a cross-section view of the same device as shown in FIG. 3, except now the substrate has been substantially thinned to thickness $t_2$, where $t_2 < t_1$. For this new device 400, a portion of the electric field lines 314 extending from the first co-planar structure 302 to the next nearest neighbor structure 306 travel through an air or vacuum region below the substrate 308. As a result, the effective dielectric constant, $\varepsilon_{NNN}$, for capacitive coupling to the next nearest neighbor co-planar structure is reduced to less than the weighted average of the dielectric constant $\varepsilon_s$ of the substrate 308 and the region above the co-planar structures. In some implementations, the thinning of the substrate 308 can be great enough that the effective dielectric constant $\varepsilon_{NNN}$ is closer to the dielectric constant of vacuum or air (i.e., $\varepsilon \approx 1$). At the same time, the effective dielectric constant, $\varepsilon_{NN}$, for capacitive coupling to the nearest neighbor co-planar structure can be maintained at a higher value that is closer to the dielectric constant of the substrate. Thus, by reducing the thickness of the substrate, it is possible, in some implementations, to reduce the strength of stray capacitive coupling between a first co-planar structure and one or more next nearest neighbor co-planar structures, while maintaining a stronger desired capacitive coupling to a nearest neighbor structure.

Stated another way, by decreasing the substrate thickness in the device, the effective dielectric constant can be set above a first threshold between a first co-planar structure and a second co-planar structure that is a nearest neighbor to the first structure, and less than a second threshold between the first co-planar structure and a third co-planar structure that is a next-nearest neighbor to the first structure, in which the second threshold is less than the first threshold, and in which the first threshold corresponds to high coupling strength relative to the coupling strength represented by the second threshold (which is low relative to the coupling strength represented by the first threshold). In some implementations, the first threshold and the second threshold can differ by about an order of magnitude. In some implementations, the first threshold and the second threshold can differ by less than an order of magnitude. For example, the effective dielectric constant between the first co-planar structure and the second co-planar structure that is a nearest neighbor can be set to a value that is greater than or equal to a first threshold of approximately 8 and the effective dielectric constant between the first co-planar structure and the third co-planar structure that is a next-nearest neighbor can be set to a value that is less than or equal to a second threshold of approximately 2. In other examples, the first threshold can be greater than or equal to approximately 7 and the second threshold can be less than or equal to approximately 5, the first threshold can be greater than or equal to approximately 8 and the second threshold can be less than or equal to approximately 4, the first threshold can be greater than or equal to approximately 9 and the second threshold can be less than or equal to approximately 3, the first threshold can be greater than or equal to approximately 10 and the second threshold can be less than or equal to approximately 2, the first threshold can be greater than or equal to approximately 11 and the second threshold can be less than or equal to approximately 2, or the first threshold can be greater than or equal to approximately 10 or 11 and the second threshold can be equal to approximately 1. The approximate effective dielectric constant can be within an uncertainty based on the accuracy and/or precision limitations of the metrology technique(s) with which the effective dielectric constant is determined.

The effective dielectric constant E for the configurations shown in FIGS. 3 and 4, in which it is assumed the region beneath the substrate 308 is air or vacuum, can be expressed using the following equation:

$$\frac{\varepsilon}{r^3} \rightarrow \frac{\varepsilon_a}{2r^3} + \frac{\varepsilon_s}{2r^3} f(r), \quad (2)$$

where $\varepsilon_a$ is the dielectric constant of the air or vacuum region, $\varepsilon_s$ is the dielectric constant of the substrate, r is the distance between the centroids of the co-planar structures of concern, and f(r) is a screening factor that serves as a weighting factor for the substrate dielectric constant based on the substrate's thickness. The screening factor f(r) can be expressed as:

$$f(r) = 1 + 2 \sum_{n=1,2}^{\infty} \alpha^n \frac{r^3}{[r^2 + (2tn)^2]^{3/2}} \left[ 1 - \frac{3}{1 + (r/2tn)^2} \right], \quad (3)$$

where $\alpha = (\varepsilon_a - \varepsilon_s)/(\varepsilon_a + \varepsilon_s)$, t is the substrate thickness, and n is a number of image dipoles in the z direction. Thus, using Eqs. (2) and (3), it is possible to determine the effective dielectric constant between two co-planar structures if the substrate thickness t, the distance between the electrodes' centroids r, and the corresponding substrate and ambient region dielectric constants are known. The effective dielectric constant determined from these equations then can be used with Eq. (1) to determine the resulting coupling capacitance. Similarly, Eqs. (1)-(3) can be used to identify a predetermined or desired coupling capacitance between selected co-planar structures, and then determine what substrate thickness t and/or distance r can be used to achieve the desired/predetermined coupling capacitance. For the special case where r>>t, the effective dielectric constant should be close to that of the ambient region (e.g., air or vacuum).

As an example, assume the co-planar structures in both device 300 and device 400 correspond to high quality factor qubits having co-planar waveguide configuration similar to that shown in FIG. 1, in which a centerline and gap width, w+2 g, is less than about 100 µm and in which the distance between a centroid of the first co-planar structure 302 and a centroid of the next nearest neighbor co-planar structure 306 is about 500 µm. Assuming a substrate thickness $t_1$ of device 300 equal to about 500 µm, then the effective dielectric constant $\varepsilon_{NNN}$ associated with capacitive coupling between the first and third co-planar structures is approximately equal to the dielectric constant of the substrate. For a substrate formed from sapphire, the effective dielectric constant $\varepsilon_{NNN}$ then is equal to approximately 10 (measured at a temperature of 50 mK and an applied frequency of between approximately 4-6 GHz). Thus, the effective dielectric constant is enhanced relative to vacuum, due to the substrate, out to distances 3 mm away from the first co-planar structure (e.g., along the x-direction in FIG. 3).

In contrast, if a thinned device, such as device 400, is used instead, in which the substrate thickness $t_2$ is about 100 µm, but the other parameters remain the same (i.e., assuming a w+2 g less than about 100 µm, a distance of 500 µm between centroids, and an ambient region of air or vacuum), the effective dielectric constant $\varepsilon_{NNN}$ can be reduced to approximately 1. The reduction in $\varepsilon_{NNN}$ can lead to a decrease in stray next nearest neighbor capacitance by 500% or more. This is because the effective dielectric constant is reduced from about (1+10)/2=5.5 to about (1+1)/2=1. Furthermore, the reduction in $\varepsilon_{NNN}$ can also lead to a decrease in the off-resonance interactions between qubits (in particular, by a factor of about 25 for this example). This is because such off-resonance interactions between qubits scale with the square of the coupling capacitance. Stated another way, the phase error, $\Omega_{ZZ}$, induced by the off-resonance interactions can be expressed as $\Omega_{ZZ} = -2 \, g^2 \, (\eta_1 + \eta_2)/(\Delta - \eta_1)(\Delta + \eta_2)$, where g is the swap rate, which depends on the capacitance linearly, $\eta_1$ and $\eta_2$ are qubit nonlinearities, and $\Delta$ is the detuning between the qubit transition frequencies. In addition, since the co-planar structures for the example in FIG. 4 have a w+2 g less than about 100 µm (and thus a screening factor of about 1), the thinned wafer does not affect the qubit performance. Accordingly, the area of the co-planar structures can be increased (e.g., along the x and/or y directions in FIG. 4) in order to further reduce the loss associated with the surface dielectrics as explained with respect to FIG. 1 above.

Fabrication of the devices disclosed herein can include traditional photolithography and deposition techniques. For instance, the substrate may include a silicon or sapphire wafer on which the superconductor material used to form the co-planar structures is deposited and patterned. The deposition can be performed using, e.g., a physical vapor deposition process such as sputtering, thermal evaporation, or e-beam deposition. Other deposition processes may be used instead. The deposited superconductor may be patterned using a lift-off process where, e.g., the superconductor is deposited over patterned photoresist and then removed only in those locations where the resist is present on the substrate surface. Alternatively, the superconductor material may be patterned using photolithography to define a pattern in resist on the surface of the superconductor, followed by wet and/or dry etching of the exposed areas of the superconductor. The thickness of the deposited superconductor layer can be selected based on the desired end use for the superconductor (e.g., whether the layer will be part of a ground plane, a plate of a capacitor, a routing wire, a microstrip, a resonator, or other component). As an example the thickness of the superconductor layer can range between about 1 nm to about 1 micron, though other thicknesses are also possible. In some implementations, the substrate is provided with the thickness that allows the desired effective dielectric constant thresholds to be obtained. In other implementations, the substrate is thinned to obtain the thickness that allows the desired effective dielectric constant thresholds to be obtained. Such thinning may be performed on the wafer backside before or after the circuit elements are fabricated on the wafer topside. Wafer backgrinding, also referred to as "backlap" or "wafer thinning," is a process in which the backside of a wafer is ground down. For example, most silicon wafers are manufactured at roughly 750 µm thickness, but through backgrinding can be reduced to as little as 50 µm or less. Other methods of thinning wafers are also available, including chemical mechanical polishing, chemical wet etching and plasma dry etching processes.

Figure 5:
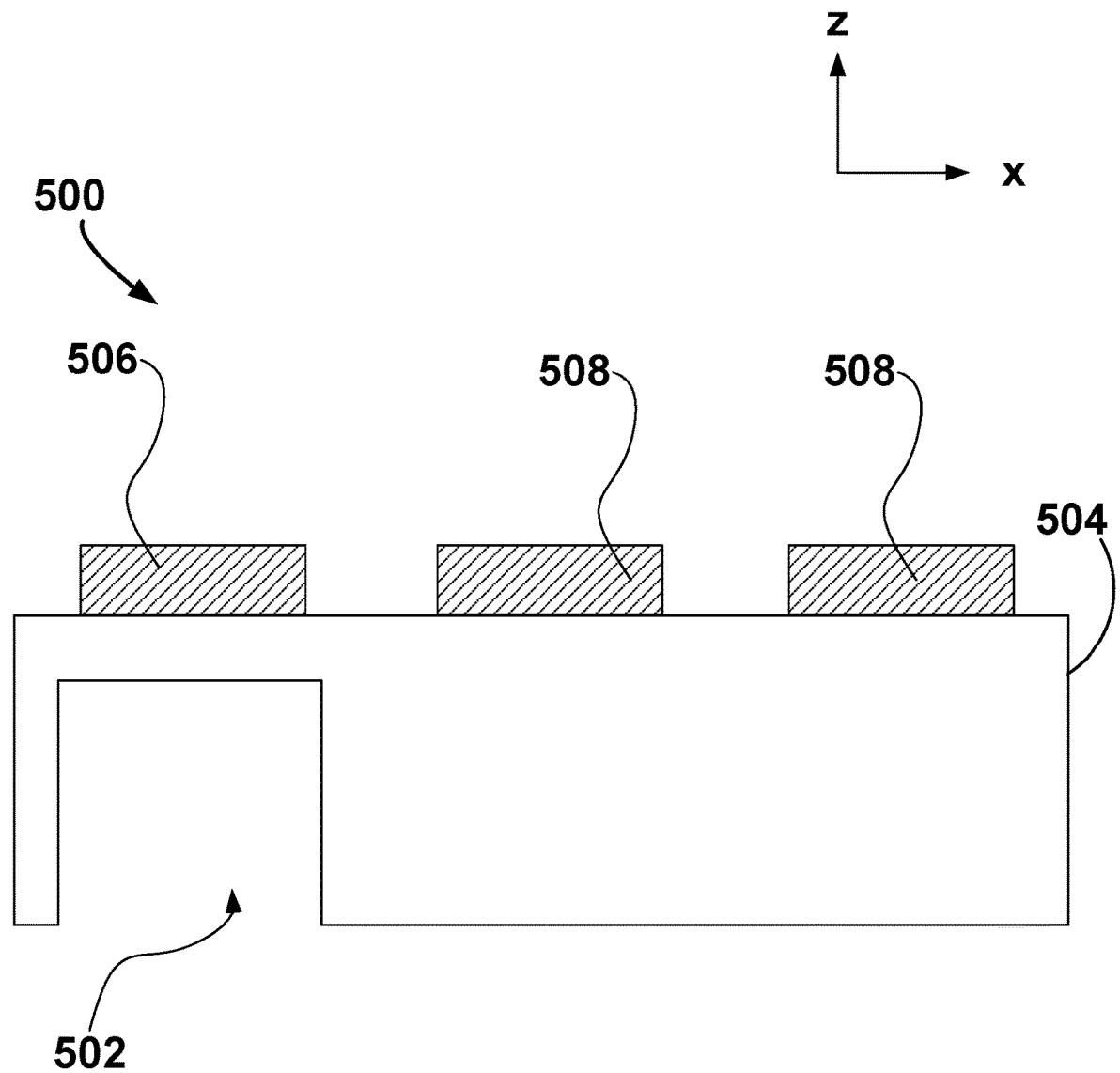
FIG. 5 is a schematic that illustrates an example of a structure in which a portion of a substrate beneath a co-planar structure has been removed.

Modifying the effective dielectric constant for the purpose of reducing stray coupling capacitance does not have to be limited to thinning the entire wafer backside surface. For example, in some implementations, a portion of the substrate backside that is less that the entire backside can be removed to selectively improve the capacitive isolation of one or more co-planar structures. For example, in some implementations, one or more portions of a substrate, located beneath one or more respective co-planar structures formed on the substrate, can be selectively removed to create regions of the substrate that are thinner relative to other substrate regions where substrate material has not been removed. To selectively remove portions of the substrate, the backside of the wafer or chip can be coated with a patterned etch stop layer (e.g., photoresist or other material) and then the exposed portions of the substrate can be removed using a wet or dry etch as appropriate. FIG. 5 is a schematic that illustrates an example of a structure 500 in which a portion of a substrate 504 directly beneath a co-planar structure 506 has been removed. The thinned region 502 provides a lower effective dielectric constant for the structure 506 relative to the effective dielectric constant of nearby structures 508, thus reducing stray capacitive coupling to the structure 506. The amount of thinning of the substrate can depend on the desired capacitive coupling to be achieved. Though the portion that is removed is shown in FIG. 5 as being located directly beneath the co-planar structure, in some implementations, the portion of the substrate that is removed can be offset in a lateral direction relative to a location of the co-planar structure 506 (e.g., along the positive or negative x-direction). Alternatively, or in addition, in some implementations, multiple different portions of the substrate can be removed in different areas of the substrate so as to provide improved capacitive isolation of multiple co-planar structures.

Embodiments of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the embodiments described above should not be understood as requiring such separation in all embodiments.

A number of embodiments have been described. Nevertheless, it will be understood that various modifications may be made without departing from the spirit and scope of the invention. Other embodiments are within the scope of the following claims.

What is claimed is:

1. A quantum device comprising:
   a substrate having a substrate dielectric constant; and
   at least three co-planar structures arranged on a surface of the substrate, each co-planar structure, of the at least three co-planar structures, comprising a superconductor,
   wherein a first effective dielectric constant between a first co-planar structure and a second co-planar structure of the at least three co-planar structures that is a nearest neighbor to the first co-planar structure is above a first threshold,
   a second effective dielectric constant between the first co-planar structure and a third coplanar structure of the at least three co-planar structures that is a next nearest neighbor to the first co-planar structure is less than a second threshold, the second threshold is less than the first threshold, and
   wherein the first effective dielectric constant comprises a first weighted average of the substrate dielectric constant and a dielectric constant of an ambient region external and adjacent to the substrate, and the second effective dielectric constant comprises a second weighted average of the substrate dielectric constant and the dielectric constant of the ambient region external and adjacent to the substrate, and
   wherein a contribution of the dielectric constant of the ambient region to the second effective dielectric constant is greater than a contribution of the dielectric constant of the ambient region to the first effective dielectric constant.

2. The quantum device of claim 1, wherein the ambient region comprises a vacuum.

3. The quantum device of claim 1, wherein the substrate comprises silicon.

4. The quantum device of claim 1, wherein the substrate comprises sapphire.

5. The quantum device of claim 1, wherein the superconductor comprises aluminum.

6. The quantum device of claim 1, wherein the superconductor comprises niobium.

7. The quantum device of claim 1, wherein at least one co-planar structure, of the at least three co-planar structures, comprises a corresponding qubit.

8. The quantum device of claim 1, wherein the at least three co-planar structures are arranged in a 1-D array.

9. The quantum device of claim 1, wherein at least one co-planar structure, of the at least three co-planar structures, comprises a corresponding arm of an inter-digitated capacitor.

10. The quantum device of claim 1, wherein the first co-planar structure is separated from the second co-planar structure by a first gap, and the second co-planar structure is separated from the third co-planar structure by a second gap.

11. A quantum device comprising:
a substrate; and
at least three co-planar structures arranged on a surface of the substrate, each co-planar structure, of the at least three co-planar structures, comprising a superconductor,
wherein a first effective dielectric constant between a first co-planar structure and a second co-planar structure of the at least three co-planar structures that is a nearest neighbor to the first co-planar structure is above a first threshold,
a second effective dielectric constant between the first co-planar structure and a third coplanar structure of the at least three co-planar structures that is a next nearest neighbor to the first co-planar structure is less than a second threshold,
the second threshold is less than the first threshold, and
wherein at least one co-planar structure, of the at least three co-planar structures, comprises a corresponding co-planar waveguide.

12. A quantum device comprising:
a substrate; and
at least three co-planar structures arranged on a surface of the substrate, each co-planar structure, of the at least three co-planar structures, comprising a superconductor,
wherein a first effective dielectric constant between a first co-planar structure and a second co-planar structure of the at least three co-planar structures that is a nearest neighbor to the first co-planar structure is above a first threshold,
a second effective dielectric constant between the first co-planar structure and a third coplanar structure of the at least three co-planar structures that is a next nearest neighbor to the first co-planar structure is less than a second threshold, the second threshold is less than the first threshold, and
wherein the at least three co-planar structures are arranged in a 2-D array.

13. A quantum device comprising:
a substrate; and
at least three co-planar structures arranged on a surface of the substrate, each co-planar structure, of the at least three co-planar structures, comprising a superconductor,
wherein a first effective dielectric constant between a first co-planar structure, of the at least three co-planar structures, and a second co-planar structure, of the at least three co-planar structures, is above a first threshold,
a second effective dielectric constant between the first co-planar structure and a third co-planar structure, of the at least three co-planar structures, is less than a second threshold,
a first distance between the first co-planar structure and the second co-planar structure is less than a second distance between the first co-planar structure and the third co-planar structure,
the second threshold is less than the first threshold, and
wherein the first distance is between a centroid of the first co-planar structure and a centroid of the second co-planar structure, and the second distance is between the centroid of the first co-planar structure and a centroid of the third co-planar structure.

14. A quantum device comprising:
a substrate having a substrate dielectric constant; and
at least three co-planar structures arranged on a surface of the substrate, each co-planar structure, of the at least three co-planar structures, comprising a superconductor,
wherein a first effective dielectric constant between a first co-planar structure, of the at least three co-planar structures, and a second co-planar structure, of the at least three co-planar structures, is above a first threshold,
a second effective dielectric constant between the first co-planar structure and a third co-planar structure, of the at least three co-planar structures, is less than a second threshold,
a first distance between the first co-planar structure and the second co-planar structure is less than a second distance between the first co-planar structure and the third co-planar structure,
the second threshold is less than the first threshold,
wherein the first effective dielectric constant comprises a first weighted average of the substrate dielectric constant and a dielectric constant of an ambient region external and adjacent to the substrate, and the second effective dielectric constant comprises a second weighted average of the substrate dielectric constant and the dielectric constant of the ambient region external and adjacent to the substrate, and
wherein a contribution of the dielectric constant of the ambient region to the second effective dielectric constant is greater than a contribution of the dielectric constant of the ambient region to the first effective dielectric constant.

15. The quantum device of claim 14, wherein each co-planar structure, of the at least three co-planar structures, comprises a corresponding qubit, co-planar waveguide, or interdigitated capacitor.

16. The quantum device of claim 14, wherein the substrate dielectric constant of the first weighted average is weighted to a first value, and the substrate dielectric constant of the second weighted average is weighted to a second different value.

* * * * *